United States Patent
Tyan et al.

(10) Patent No.: US 9,318,184 B2
(45) Date of Patent: Apr. 19, 2016

(54) SIGNAL RECEIVER

(71) Applicant: MStar Semiconductor, Inc., Hsinchu Hsien (TW)

(72) Inventors: Eer-Wen Tyan, Hsinchu County (TW); Yu-Chieh Hung, Hsinchu County (TW); Jian-Feng Shiu, Hsinchu County (TW); Chao-An Chen, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/339,811

(22) Filed: Jul. 24, 2014

(65) Prior Publication Data

US 2015/0028954 A1  Jan. 29, 2015

(30) Foreign Application Priority Data

Jul. 24, 2013  (TW) .............................. 102126544 A

(51) Int. Cl.
| | |
|---|---|
| H03K 19/0175 | (2006.01) |
| H03K 19/094 | (2006.01) |
| G11C 11/4076 | (2006.01) |
| H03F 3/21 | (2006.01) |
| H03F 3/45 | (2006.01) |
| G11C 7/10 | (2006.01) |

(52) U.S. Cl.
CPC .......... *G11C 11/4076* (2013.01); *G11C 7/1084* (2013.01); *H03F 3/211* (2013.01); *H03F 3/45188* (2013.01); *H03F 2203/45702* (2013.01)

(58) Field of Classification Search
None
See application file for complete search history.

(56) References Cited

U.S. PATENT DOCUMENTS

| | | | | |
|---|---|---|---|---|
| 6,930,530 | B1 * | 8/2005 | Wang | 327/333 |
| 8,698,559 | B2 * | 4/2014 | Kasanyal | 330/253 |
| 2005/0231261 | A1 * | 10/2005 | Chen | 327/333 |
| 2012/0229214 | A1 | 9/2012 | Kasanyal | |

OTHER PUBLICATIONS

Taiwan Patent Office, "Office Action," Aug. 20, 2015.

* cited by examiner

*Primary Examiner* — Anh Tran
(74) *Attorney, Agent, or Firm* — WPAT, PC; Justin King

(57) ABSTRACT

A signal receiver includes a current source providing a current having a current value, a pair of active input devices, and a pair of resistors. Each active input device includes a control node, a first conduction node, and a second conduction node. One of the control nodes receives an input signal. The first conduction nodes are connected to each other and receive the current. One of the second conduction nodes serves as an output node. The active input devices output an output signal to a core circuit according to the current and the input signal. Each resistor has a resistance value. A target voltage value is determined according to the resistance value and the current value, such that a voltage swing of the output signal is limited within the target voltage value, and an operating voltage of the core circuit is substantially equal to the target voltage value.

9 Claims, 2 Drawing Sheets

SIGNAL RECEIVER

This application claims the benefit of Taiwan application Serial No. 102126544, filed Jul. 24, 2013, the subject matter of which is incorporated herein by reference.

BACKGROUND OF THE INVENTION

1. Field of the Invention

The invention relates in general to a signal receiver, and more particularly, to a signal receiver that is tolerant of high-voltage signals.

2. Description of the Related Art

Accompanied by the perpetual evolvement of integrated circuit manufacturing technologies, the operating voltage in the integrated circuits continues to decrease. In new-generation integrated circuits, it is a common occurrence that external signals from old-generation integrated circuits are received. The voltage of these external signals is likely higher than the operating voltage of the new-generation integrated circuits.

Take a double-data-rate three synchronous dynamic random access memory (DDR3 SDRAM) for example. The specified operating voltage of the DDR3 SDRAM is 1.5V, whereas the operating voltages of the DDR1 and DDR2 SDRAMs are 2.5V and 1.8V, respectively. In the latest DDR4, the operating voltage is reduced to even as low as 1.2V. That is to say, for example, a receiver that is simultaneously compliant with DDR2/3/4 needs to withstand and process input signals having an operating voltage range from 1.2V to 1.8V.

Apart from the considering the tolerance for high-voltage signals, the design of a DDR receiver also needs to take factors including the output voltage slew rate, power consumption, signal propagation delay and circuit hardware costs into account. A circuit design is regarded satisfactory only when the numerous factors above are optimized.

SUMMARY OF THE INVENTION

According to an embodiment of the present invention, a signal receiver is provided. The signal receiver includes a current source, a pair of active input devices, and a pair of resistors. The current source provides a current having a current value. Each of the active input devices has a control node, a first conduction node a second conduction node. One of the control nodes of the active input devices receives an input signal. The first conduction nodes are connected to each other, and receive the current. One of the second conduction nodes serves as an output node. The pair of active input devices output an output signal to a core circuit according to the current and the input signal. Each resistor has a resistance value and is connected between one of the second conduction nodes and a power line. A target voltage value is determined according to the resistance value and the current value, such that a voltage swing of the output signal is limited within the target voltage value, and an operating voltage of the core circuit is substantially equal to the target voltage value.

According to another embodiment of the present invention, a signal receiver is provided. The signal receiver includes a first-stage amplifier and a second-stage amplifier. The first-stage amplifier receives an input signal, and processes the input signal according to a first voltage gain to provide a first output signal. The first-stage amplifier is constructed such that a voltage swing of the first output signal is not greater than a predetermined value. The second-stage amplifier receives the first output signal, and processes the first output signal according to a second voltage gain to generate a second output signal to a core circuit. The second-stage amplifier is constructed such that a voltage swing of the second output signal is not greater than the predetermined value. The second voltage gain is greater than the first voltage gain, and the first voltage gain is greater than 1. The core circuit is powered by a high-power digital circuit line and a low-power digital circuit line. The predetermined value is substantially equal to a voltage difference between the high-power digital circuit line and the low-power digital circuit line.

The above and other aspects of the invention will become better understood with regard to the following detailed description of the preferred but non-limiting embodiments. The following description is made with reference to the accompanying drawings.

DETAILED DESCRIPTION OF THE INVENTION

A DDR receiver is taken as an example in the non-limiting embodiments of the present invention described below. However, it is to be understood that the present invention is not limited to such example. For example, in other embodiments, the receiver of the present invention may be a single-end signal receiver amplifier or a differential signal receiver amplifier.

Figure 1:
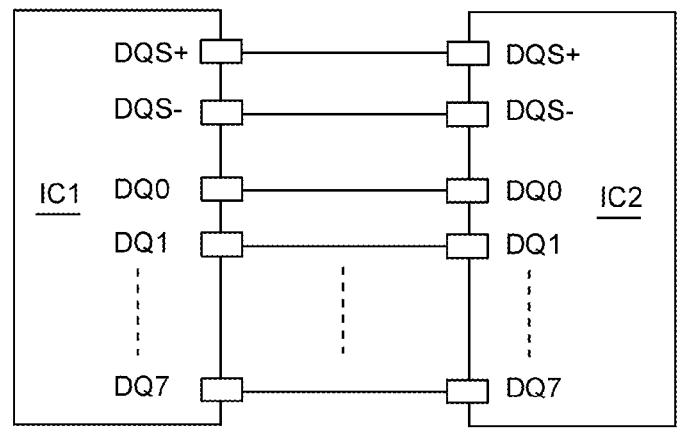
FIG. 1 shows two integrated circuits IC1 and IC2 adopting the DDR3 specification for communication.

FIG. 1 shows two integrated circuits IC1 and IC2 adopting the DDR3 specification for communication. Pins DQS+ and DQS− are for transceiving data queue strobe (DQS) represented by a differential signal, and pins DQ0 to DQ7 are for transceiving data signals. As specified in the DDR3 specification, the rising edge and the falling edge of the data queue strobe DQS may define the read or write time of one byte transmitted from the pins DQ0 to DQ7 of the integrated circuits 101 and 102.

To satisfy both requirements of the tolerance for signals having higher voltages from an older generation integrated circuit and maintaining a high data processing speed, an integrated circuit according to an embodiment at least includes two devices—a core device and a high-voltage tolerable device. The high-voltage tolerant device has a higher voltage tolerance, and the core device has a faster operating speed. For example, the core device and the high-voltage tolerant device are both MOS devices, and the gate oxidation layer of the high-voltage tolerant device is larger than that of the core device. The integrated circuit includes a core circuit and an input/output (I/O) circuit, which respectively adopt the core device and the high-voltage tolerant device. Instead of being entirely formed by the core device, the core circuit may also adopt certain high-voltage tolerant devices depending on requirements of the circuit design. Similarly, instead of being entirely formed by the high-voltage tolerant device, the high-voltage tolerant circuit may also adopt certain core devices depending on requirements of the circuit design. Acting as an external window of the integrated circuit, the I/O circuit includes pads. For example, the pads may be formed with solder lines to electrically connect to pins of an integrated circuit.

The core circuit is generally a digital circuit, and is substantially powered by a high-power digital circuit line VDDdigital and a low-power digital circuit line VSSdigital. The I/O circuit is generally an analog circuit, and is substantially powered by a high-power analog circuit line VDDanalog and a low-power analog circuit line VSSanalog. In the non-limiting embodiments below, for example, the digital circuit lines VDDdigital and VSSdigital, and the analog circuit lines VDDanalog and VSSanalog, have voltage values 1.1V, 0V, 1.8V and 0V, respectively. As the digital circuit line VSSdigital and the analog circuit line VSSanalog are both 0V (grounded), they can be connected in series or parallel, or be replaced by each other. Depending on design requirements, a part of the circuits in the I/O circuit may be powered by the digital power lines VDDdigital and VSSdigital. When necessary, a part of the circuits in the core circuit may also be powered by the analog circuit lines VDDanalog and VSSanalog.

Figure 2:
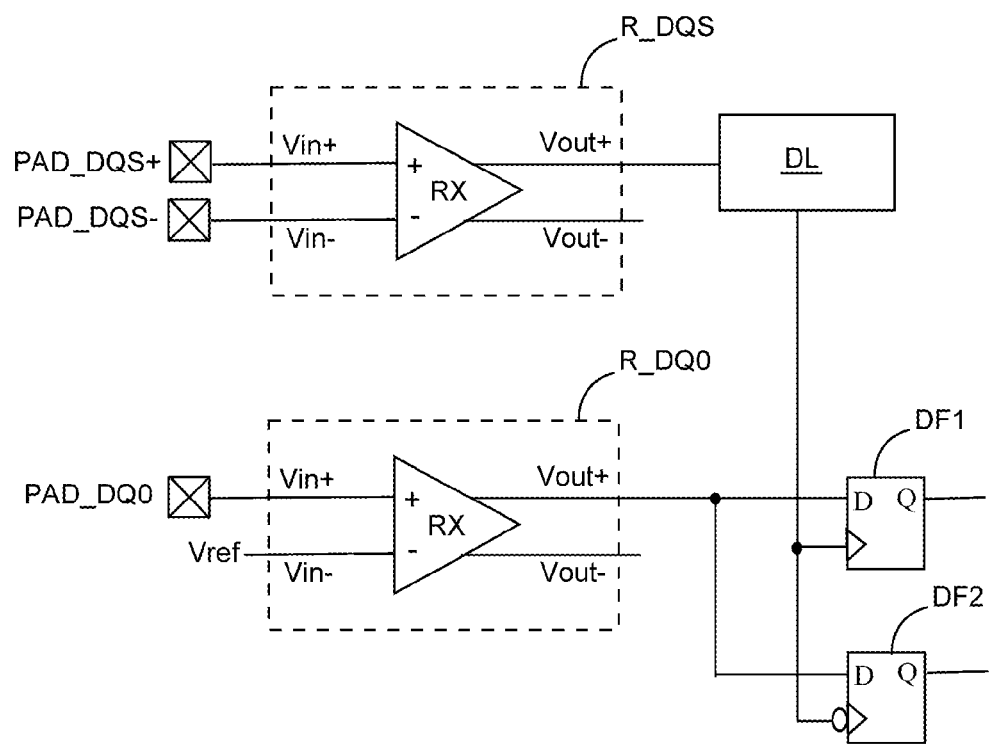
FIG. 2 shows two signal receivers R_DQS and R_DQ0 as well as associated circuits according to an embodiment of the present invention.

FIG. 2 shows two signal receivers R_DQS and R_DQ0 as well as associated circuits according to an embodiment of the present invention. The signal receivers R_DQS and R_DQ0 may be implemented in the integrated circuit 101 or 102 in FIG. 1. In FIG. 2, the signal receivers R_DQS and R_DQ0 have an identical architecture, which includes two signal input nodes Vin+ and Vin−, and two signal output nodes Vout+ and Vout−. The signal receivers R_DQS and R_DQ0 may be I/O circuits, and a delay circuit DL and two D flip-flops DF1 and DF2 may be core circuits.

The signal input node Vin+ of the signal receiver R_DQ0 is connected to a pad PAD_DQ0 that is electrically connected to a pin DQ0 (in FIG. 1). The signal input node Vin− of the signal receiver R_DQ0 is connected to a constant reference voltage Vref. For example, the reference voltage Vref may be 0.75V or 0.9V, depending on whether the signal receiver R_DQ0 is applied to DDR3 or DDR2. The signal output node Vout− of the signal receiver R_DQ0 is kept floating, and the signal output node Vout+ is connected to inputs of the two D flip-flops DF1 and DF2. The signal receiver R_DQ0 serves as a single-input comparator, which determines the logic value of the input signal from the pin DQ0 and generates a result at the signal output node Vout+.

The signal input nodes Vin+ and Vin− of the signal receiver R_DQS are connected to pads PAD_DQS+ and PAD_DQS−, respectively. The pads PAD_DQS+ and PAD_DQS− are electrically connected to pins DQS+ and DQS− (in FIG. 1), respectively. The signal output node Vout+ of the signal receiver R_DQS is connected to a delay circuit DL, which drives clock ends of the two D flip-flops DF1 and DF2. In other words, the signal receiver R_DQS serves as a differential amplifier comparator that receives the data queue strobe DQS from the pins DQS+ and DQS−. After a period of delay time following the rising edge or falling edge of the data queue strobe DQS, the result generated by the signal receiver R_DQ0 is recorded in the D flip-flop DF1 or DF2.

Despite the signal receiver R_DQ0 for the data signal DQ0 is depicted in FIG. 2, the structures and operation details of the signal receivers corresponding to the other data signals DQ1 to DQ7 can be deduced based on the teaching of the disclosure, and shall be omitted herein.

Figure 3:
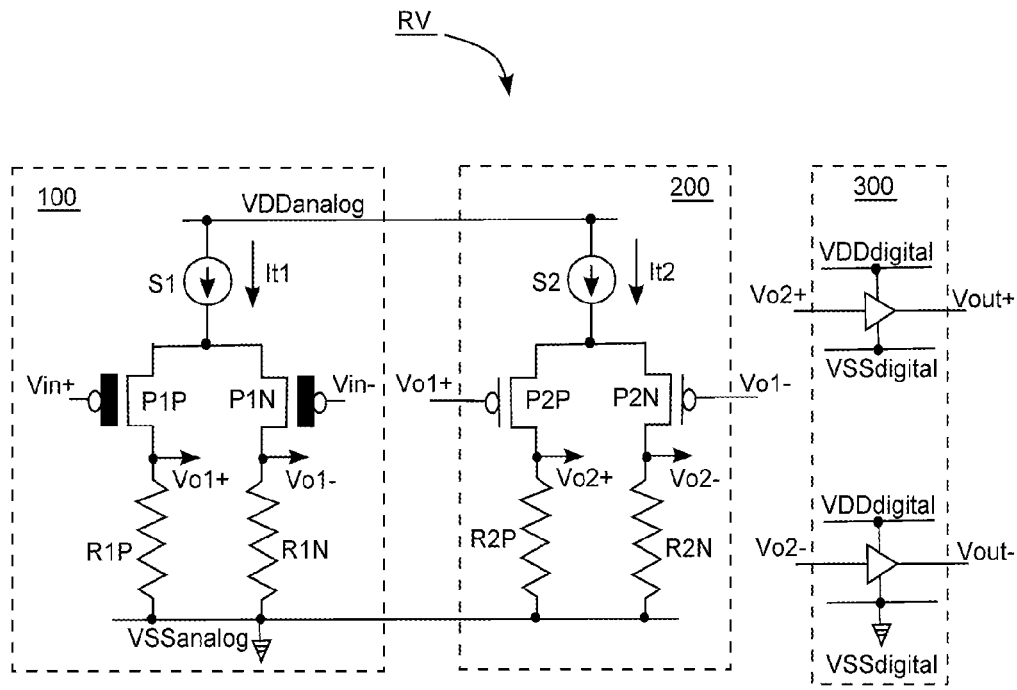
FIG. 3 shows a signal receiver RV that can serve as the signal receiver R_DQS or R_DQ0 shown in FIG. 2.

FIG. 3 shows a signal receiver RV that may serve as the signal receiver R_DQS or R_DQ0 in FIG. 2. The signal receiver RV is capable of converting an analog DDR signal on a pad to a digital signal applicable to the core circuit.

The signal receiver RV has input nodes Vin+ and Vin−, and output nodes Vout+ and Vout−. The signal receiver RV is substantially divided into three cascaded stages—differential amplifiers 100 and 200, and a buffer stage 300. Fundamentally, the differential amplifiers 100 and 200 amplify signals and perform level shifting on the signals, and so the voltage signal gains of the differential amplifiers 100 and 200 are both greater than 1. The buffer stage 300 increases the fanout, i.e., increasing the driving capability of the signal receiver RV.

The differential amplifiers 100 and 200 are powered by a high-power analog circuit line VDDanalog and a low-power analog circuit line VSSanalog (having voltages 1.8V and 0V, respectively). It should be noted that, according to an embodiment of the present invention, the high-power analog circuit line VDDanalog may be a voltage higher than 1.8V, e.g., 3.3V. The buffer stage 300 is powered by digital circuit lines VDDdigital and VSSdigital (having voltages 1.1.V and 0V, respectively).

The differential amplifier 100 includes two PMOS P1P and P1N, a current source S1, and two passive resistors R1P and R1N. The current source S1 generates a tail current It1 from the high-power analog circuit line VDDanalog, and has a current value I11. The PMOS P1P and P1N are jointly connected to the current source S1 in form of a common source. The two PMOS P1P and P1N have their gates, i.e., two control nodes, serves as input nodes Vin+ and Vin−, respectively, and their drains connected to the resistors R1P and R1N, respectively. Both of the resistors R1P and R1N are connected to the low-power analog circuit line VSSanalog. The two resistors R1P and R1N have substantially equal resistance values RR1. The PMOS P1P and P1N have their drains further serve as differential outputs Vo1+ and Vo1− of the differential amplifier 100. A product of the current value I11 and the resistance value RR1 is equal to a constant value Vcon. In the embodiment, the constant value Vcon is equal to a voltage difference between the digital circuit lines VDDdigital and VSSdigital, i.e., equal to an operating voltage of the core circuit.

In addition to providing an amplification function, the differential amplifier 100 further performs level shifting. Regardless of the input signal of the differential amplifier 100, the common mode output voltage of the differential outputs Vo1+ and Vo1− is an average value of the digital circuit lines VDDdigital and VSSdigital. The constant value Vcon is a possible maximum voltage of the differential outputs Vo1+ and Vo1−, i.e., a possible maximum voltage swing of the differential outputs Vo1+ and Vo1−. A variation range of the differential outputs Vo1+ and Vo1− is limited within the voltage difference between the digital circuit lines VDDdigital and VSSdigital, and thus the common mode output voltage of the differential outputs Vo1+ and Vo1− may serve as an input to the core circuit.

Two PMOS P2P and P2N of the differential amplifier 200 have their gates connected to the differential outputs Vo1+ and Vo1− of the differential amplifier 100, respectively. Similar to the differential amplifier 100, in the differential amplifier 200, a product of a current value I12 of a current source S2 and a resistance value RR2 of a resistor R2P or R2N is also substantially equal to the constant value Vcon. However, the resistance value RR2 need not be equal to the resistance value RR1. As shown in FIG. 3, a circuit structure of the differential amplifier 200 is substantially the same as that of the differential amplifier 100. Operations of the differential amplifier 200 may be deduced from the previous teaching, and shall be omitted herein.

Different from the PMOS P1P and P1N of the differential amplifier 100 that are high-voltage tolerant devices, the PMOS P2P and P2N in the differential amplifier 200 are core devices. Therefore, the PMOS P1P and P1N are represented by different device symbols from those of the PMOS P2P and P2N.

The buffer stage 300 includes two simple buffers, which have their input nodes respectively connected to the differential outputs Vo2+ and Vo2− to accordingly generate signals at the signal output nodes Vout+ and Vout−. For example, each buffer is formed by two inverters connected in series, and each inverter is formed by a core device.

Figure 4:
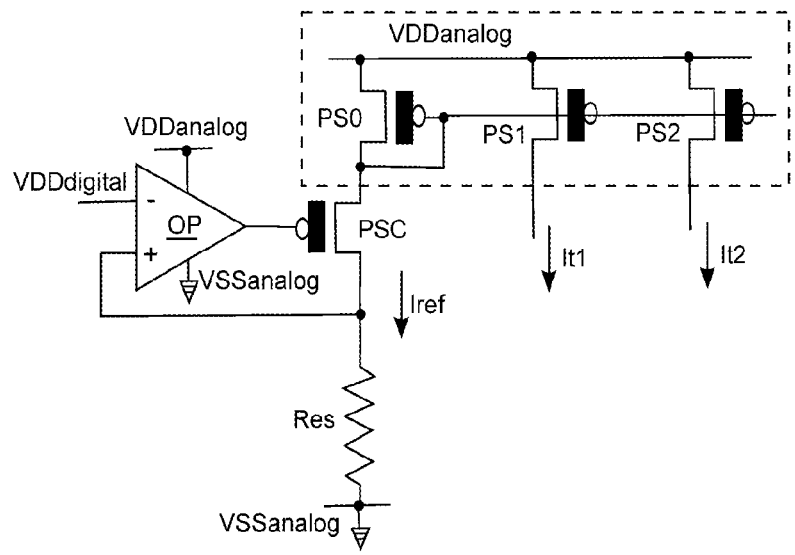
FIG. 4 shows an embodiment of current sources S1 and S2 in FIG. 3.

FIG. 4 shows an embodiment of the current sources S1 and S2 in FIG. 3. An operational amplifier OP, a PMOS PSC, and a resistor Res can generate a constant current Iref, whose value is substantially equal to the voltage value of the digital circuit line VDDdigital divided by the resistance value of the resistor Res. PMOS PS0, PS1 and PS2 form a current mirror that mirrors the constant current Iref to tail currents It1 and It2. In large, the PMOS PS1 and PS2 may be regarded as the current sources S1 and S2. In the embodiment, the PMOS PSC, PS0, PS1 and PS2 are all high-voltage tolerant devices.

The signal receiver RV in FIG. 3 has an adequate input voltage range for receiving 1.8V DDR2-compliant signals as well as 1.2V DDR4-compliant signals. This is because the differential amplifier 100 adopts high-voltage tolerant devices and passive resistors. Further, the differential amplifier 100 is capable of limiting the voltage swing on the differential outputs Vo1+ and Vo1−, in a way that the core devices in the differential amplifier 200 can be kept undamaged. The common mode output voltage of the differential outputs Vo1+ and Vo1− of the differential amplifier 200 may be designed with a high gain, thus increasing the voltage slew rate of the differential amplifier 200.

In general, the signal swing of high-speed DDR input signals greatly varies due to differences in signal patterns of these signals. To reduce the difference in signal propagation delay caused by different signal swings, a high voltage slew rate is usually a preferred solution. In addition to adopting high-gain core devices, the differential amplifier 200 also appropriately limits the voltage swing of the differential outputs Vo2+ and Vo2− to achieve a high voltage slew rate and to generate full-swing output signals. By adopting the core devices and passive resistors, the differential amplifier 200 effectively acquires a balance among gain, output voltage swing and power consumption.

For example, a differential amplifier 100 that adopts low-gain high-voltage tolerant devices may merely yield a voltage gain of 2. In contrast, the voltage gain of the differential amplifier 200 may be 10. At this point, given the signal swing of the DDR input signals is 55 mV, the signal swing of the output signals of the differential amplifier 200 may be 1.1V, which can be full-swing signals in the core circuit.

Signal propagation delay may become different with drifts in semiconductor manufacturing processes. Such difference may be enlarged as the number of stages of amplifiers increases. In the signal receiver RV, there are only two stages of amplifiers. Therefore, the difference in signal propagation delay caused by drifting semiconductor manufacturing processes can be effectively limited.

In the example of FIG. 3, the differential amplifiers 100 and 200 as well as the buffer stage 300 in the signal receiver RV are I/O circuits for explaining the non-limiting embodiments. In an alternative embodiment, only the differential amplifiers 100 and 200 are I/O circuits, and the buffer stage 300 is a core circuit. In another embodiment, only the differential amplifier 100 is an I/O circuit, and the differential amplifier 200 and the buffer stage 300 are core circuits.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A DDR signal receiver, comprising:
 a first stage amplifier, comprising:
  a first current source, configured to provide a first current having a current value;
  a first pair of active input devices, each of the first pair of active input devices having a control node, a first conduction node and a second conduction node, one control node of the pair of active input devices receiving an input signal, the first conduction nodes connected and receiving the first current, one of the second conduction nodes serving as an output nodes, the first pair of active input devices outputting an output signal to a core circuit according to the current and the input signal; and
  a first pair of resistors, each resistor having a resistance value and connected between one of the second conduction nodes and a power line; and
 a second-stage amplifier, comprising:
  a second current source, configured to provide a second current;
  a second pair of active input devices, each of the second pair of active input devices having a control node, a first conduction node and a second conduction node, the first conduction nodes of the second pair of active input devices connected to each other, the control nodes of the second pair of active input devices connected to the first-stage output nodes, respectively; and
  a second pair of resistors, each of the second pair of resistors having second resistance value and connected between one of the second conduction nodes of the second pair of active input devices and the power line;
 wherein, a target voltage value is determined according to the resistance value and the current value, such that a voltage swing of the output signal is limited within the target voltage value, and an operating voltage of the core circuit is substantially equal to the target voltage value, one of the second conduction nodes of the second pair of active input devices outputs second output signal, and a product of the second resistance value and the second current value is substantially equal to the operating voltage, the signal receiver is formed in an integrated circuit, the integrated circuit comprises a plurality of core devices and a plurality of high-voltage tolerant devices, the high-voltage tolerant devices have a higher voltage tolerance compared to the core devices, the pair of active input devices are high-voltage tolerant devices, and the second pair of active input devices are core devices.

2. The signal receiver according to claim 1, wherein the first-stage and second-stage amplifiers have first and second voltage gains, respectively, the second voltage gain is greater than the first voltage gain, and the first voltage gain is greater than 1.

3. The signal receiver according to claim 1, wherein the power line is a low-power analog circuit line, the current source is connected between the pair of active input devices and a high-power analog circuit line, and a voltage difference between the high-power analog circuit line and the low-power analog circuit line is higher than the operating voltage.

4. The signal receiver according to claim 1, wherein the other of the control nodes is coupled to a reference voltage.

5. The signal receiver according to claim 1, wherein the other of the control nodes receives another input signal, and the two input signals form a differential signal.

6. The signal receiver according to claim 1, wherein the current source comprises a high-voltage tolerant current mirror.

7. A signal receiver, comprising:
- a first-stage amplifier, configured to receive an input signal, and to process the input signal according to a first voltage gain to provide a first output signal; and
- a second-stage amplifier, configured to receive the first output signal, and to process the first output signal according to a second voltage gain to generate a second output signal to a core circuit;
- wherein a voltage swing of the second output signal is not greater than a predetermined value; wherein, the second voltage gain is greater than the first voltage gain, and the first voltage gain is greater than 1; and the core circuit is powered by a high-power digital circuit line and a low-power digital circuit line, and the predetermined value is substantially equal to a voltage difference between the high-power digital circuit line and the low-power digital circuit line,
- wherein each of the first-stage and second-stage amplifiers comprises:
  - a current source, configured to provide a current;
  - a pair of active input devices, each of the pair of active input devices having a control node, a first conduction node and a second conduction node, the control nodes of the pair of active input devices serving as two signal input nodes, the first conduction nodes connected to each other and receiving the current, the second conduction nodes serving as two signal output nodes; and
  - a pair of resistors, each of the pair of resistors having a resistance value and connected between one of the second conduction nodes and an analog circuit power line;
- wherein, a product of a current value of the current and the resistance value determines the predetermined value.

8. The signal receiver according to claim 7, wherein the first-stage amplifier receives another input signal, the input signal and the another input signal form a differential signal, a common-mode output voltage of the first-stage amplifier is substantially equal to an average voltage of the high-power digital circuit line and the low-power digital circuit line.

9. The signal receiver according to claim 7, wherein the signal receiver is formed in an integrated circuit, the integrated circuit comprises a plurality of core devices and a plurality of high-voltage tolerant devices, the pair of active input devices in the first-stage amplifier are high-voltage tolerant devices, and the pair of active input devices in the second-stage amplifier are core devices.

* * * * *